United States Patent
Rhe et al.

(10) Patent No.: US 9,927,717 B2
(45) Date of Patent: Mar. 27, 2018

(54) INSPECTION METHOD AND APPARATUS, AND LITHOGRAPHIC APPARATUS

(71) Applicant: ASML Netherlands B.V., Veldhoven (NL)

(72) Inventors: Kyu Kab Rhe, Veldhoven (NL); David Deckers, Veldhoven (NL); Hubertus Johannes Gertrudus Simons, Venlo (NL); Thomas Theeuwes, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/105,517

(22) PCT Filed: Nov. 7, 2014

(86) PCT No.: PCT/EP2014/074003
§ 371 (c)(1),
(2) Date: Jun. 16, 2016

(87) PCT Pub. No.: WO2015/090721
PCT Pub. Date: Jun. 25, 2015

(65) Prior Publication Data
US 2016/0327870 A1 Nov. 10, 2016

(30) Foreign Application Priority Data
Dec. 18, 2013 (EP) .................................. 13198051

(51) Int. Cl.
*G03F 7/20* (2006.01)
(52) U.S. Cl.
CPC ...... *G03F 7/70616* (2013.01); *G03F 7/70625* (2013.01); *G03F 7/70633* (2013.01)

(58) Field of Classification Search
CPC ............ G03F 7/70616; G03F 7/70625; G03F 7/70633
See application file for complete search history.

(56) References Cited

U.S. PATENT DOCUMENTS

| | | | |
|---|---|---|---|
| 5,573,634 | A | 11/1996 | Ham |
| 7,531,449 | B2 | 5/2009 | Park et al. |

(Continued)

FOREIGN PATENT DOCUMENTS

| | | |
|---|---|---|
| EP | 1 628 164 | 2/2006 |
| JP | H10-65148 | 3/1998 |

(Continued)

OTHER PUBLICATIONS

International Search Report and Written Opinion dated Jan. 30, 2015 in corresponding International Patent Application No. PCT/EP2014/074003.

(Continued)

*Primary Examiner* — Steven H Whitesell Gordon
(74) *Attorney, Agent, or Firm* — Pillsbury Winthrop Shaw Pittman LLP

(57) ABSTRACT

A method of correcting an image characteristic of a substrate onto which one or more product features have been formed using a lithographic process, and an associated inspection apparatus method. The method includes measuring an error in the image characteristic of the substrate, and determining a correction for a subsequent formation of the product features based upon the measured error and a characteristic of one or more of the product feature(s).

20 Claims, 5 Drawing Sheets

(56) References Cited

U.S. PATENT DOCUMENTS

| | | |
|---|---|---|
| 7,659,040 B2 | 2/2010 | Setta |
| 7,791,732 B2 | 9/2010 | Den Boef et al. |
| 7,852,459 B2 | 12/2010 | Den Boef et al. |
| 8,233,155 B2 | 7/2012 | Kiers et al. |
| 8,390,823 B2 | 3/2013 | Cramer et al. |
| 8,612,045 B2 | 12/2013 | Mos et al. |
| 8,947,642 B2 | 2/2015 | Middlebrooks |
| 2003/0091914 A1* | 5/2003 | Cho .................. G03F 7/70533 430/22 |
| 2008/0186482 A1* | 8/2008 | Den Boef .......... G03F 7/70625 356/237.2 |
| 2011/0199596 A1 | 8/2011 | Middlebrooks |
| 2012/0042290 A1 | 2/2012 | Berkens et al. |
| 2012/0227014 A1* | 9/2012 | Pforr ..................... G03F 1/70 716/52 |
| 2013/0203253 A1 | 8/2013 | Inoue et al. |
| 2013/0245985 A1* | 9/2013 | Flock ................. G03F 7/70625 702/105 |
| 2014/0117492 A1 | 5/2014 | Kim et al. |

FOREIGN PATENT DOCUMENTS

| | | |
|---|---|---|
| JP | 2008-96434 | 4/2008 |
| JP | 2009-288005 | 12/2009 |
| JP | 2012-84928 | 4/2012 |
| JP | 2013-507604 | 3/2013 |
| KR | 2003-0039599 | 5/2003 |

OTHER PUBLICATIONS

Tsugio Takahashi et al., "A Multigigabit DRAM Technology with $6F^2$ Open-Bitline Cell, Distributed Overdriven Sensing, and Stacked-Flash Fuse," IEEE Journal of Solid-State Circuits, vol. 36, No. 11, pp. 1721-1727 (Nov. 2001).

Japanese Office Action dated Apr. 3, 2017 in corresponding Japanese Patent Application No. 2016-536982.

Korean Office Action dated Nov. 20, 2017 in corresponding Korean Patent Application No. 10-2016-7019014.

\* cited by examiner

INSPECTION METHOD AND APPARATUS, AND LITHOGRAPHIC APPARATUS

This application is the U.S. national phase entry of PCT patent application no. PCT/EP2014/074003, which was filed on Nov. 7, 2014, which claims the benefit of priority of EP patent application no. 13198051.8, which was filed on Dec. 18, 2013, and which is incorporated herein in its entirety by reference.

FIELD

The present invention relates to methods of inspection usable, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Systematic errors occur in lithographic processes. These systematic errors can manifest themselves in errors on an exposed substrate. Such errors include overlay (layer-to-layer registration) errors and critical dimension (minimum feature size) errors. These errors can be measured and modelled in terms of parameters of the lithographic system. The models can be used to provide corrections for the system parameters which minimise the systematic errors in future exposures.

It is desirable to provide a method which provides improved corrections which can be used to minimise systematic errors.

SUMMARY

According to an aspect of the invention, there is provided a method of correcting an image characteristic of a substrate onto which one or more product features have been formed using a lithographic process; said method comprising: measuring an error in said image characteristic of said substrate; and determining corrections for a subsequent formation of said product features based upon the measured error and a characteristic of one or more of said product feature(s).

According to a further aspect of the invention, there is provided an inspection apparatus for inspecting a substrate onto which one or more product features have been formed using a lithographic process; said inspection apparatus being operable to: measure an error in an image characteristic of a substrate; and determine corrections for a subsequent formation of said product features based upon the measured error and a characteristic of one or more of said product feature(s).

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
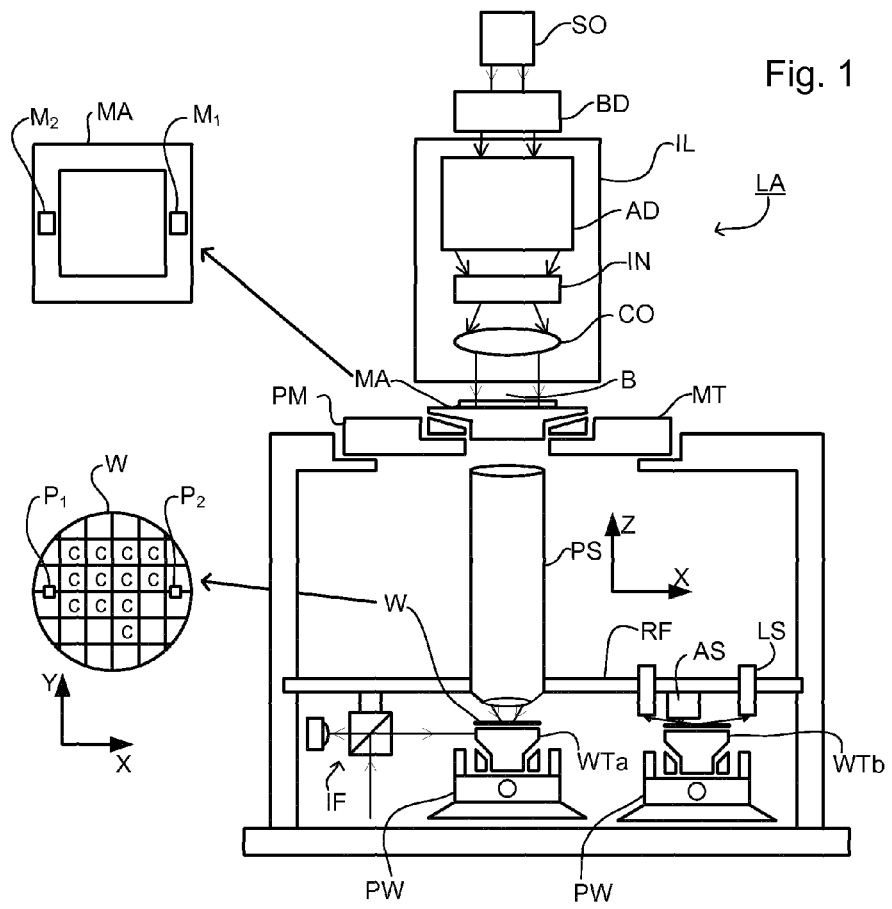
FIG. 1 depicts a lithographic apparatus.

FIG. 1 schematically depicts a lithographic apparatus. The apparatus comprises:
  an illumination system (illuminator) IL configured to condition a radiation beam B (e.g. UV radiation or DUV radiation).
  a support structure (e.g. a mask table) MT constructed to support a patterning device (e.g. a mask) MA and connected to a first positioner PM configured to accurately position the patterning device in accordance with certain parameters;
  a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Similarly, in situations in which more than one die is provided on the mask MA, the mask alignment marks may be located between the dies.

The depicted apparatus could be used in at least one of the following modes:
1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
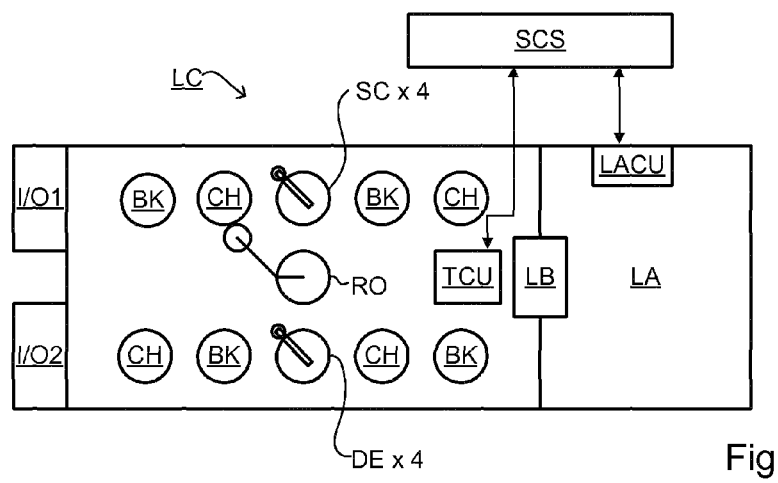
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
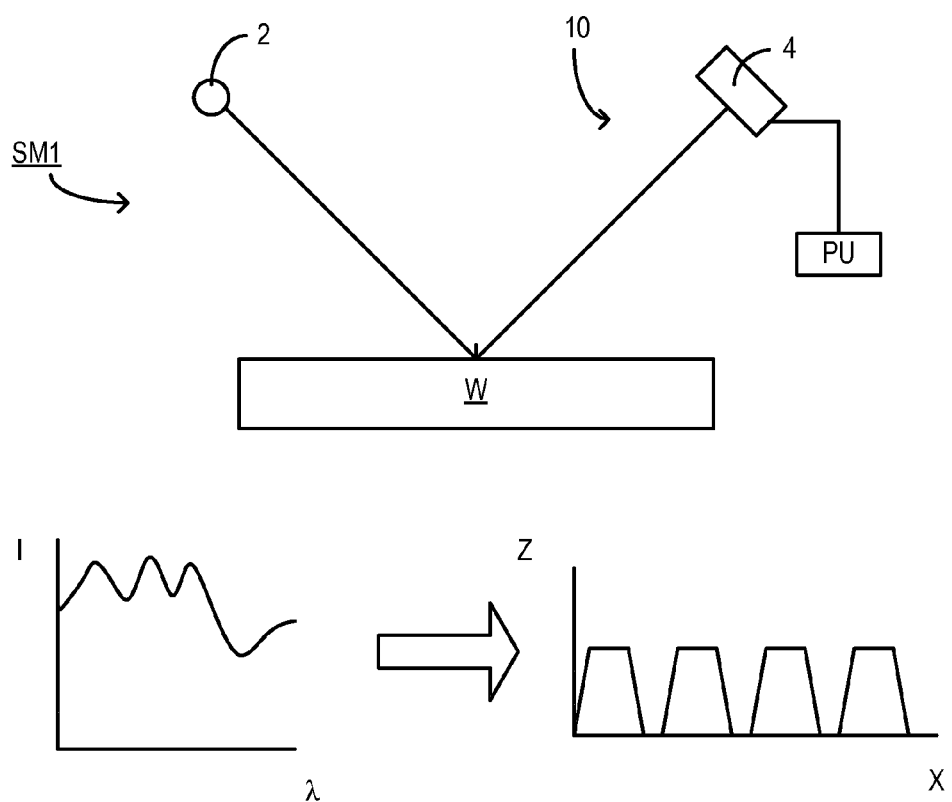
FIG. 3 depicts a first scatterometer.

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
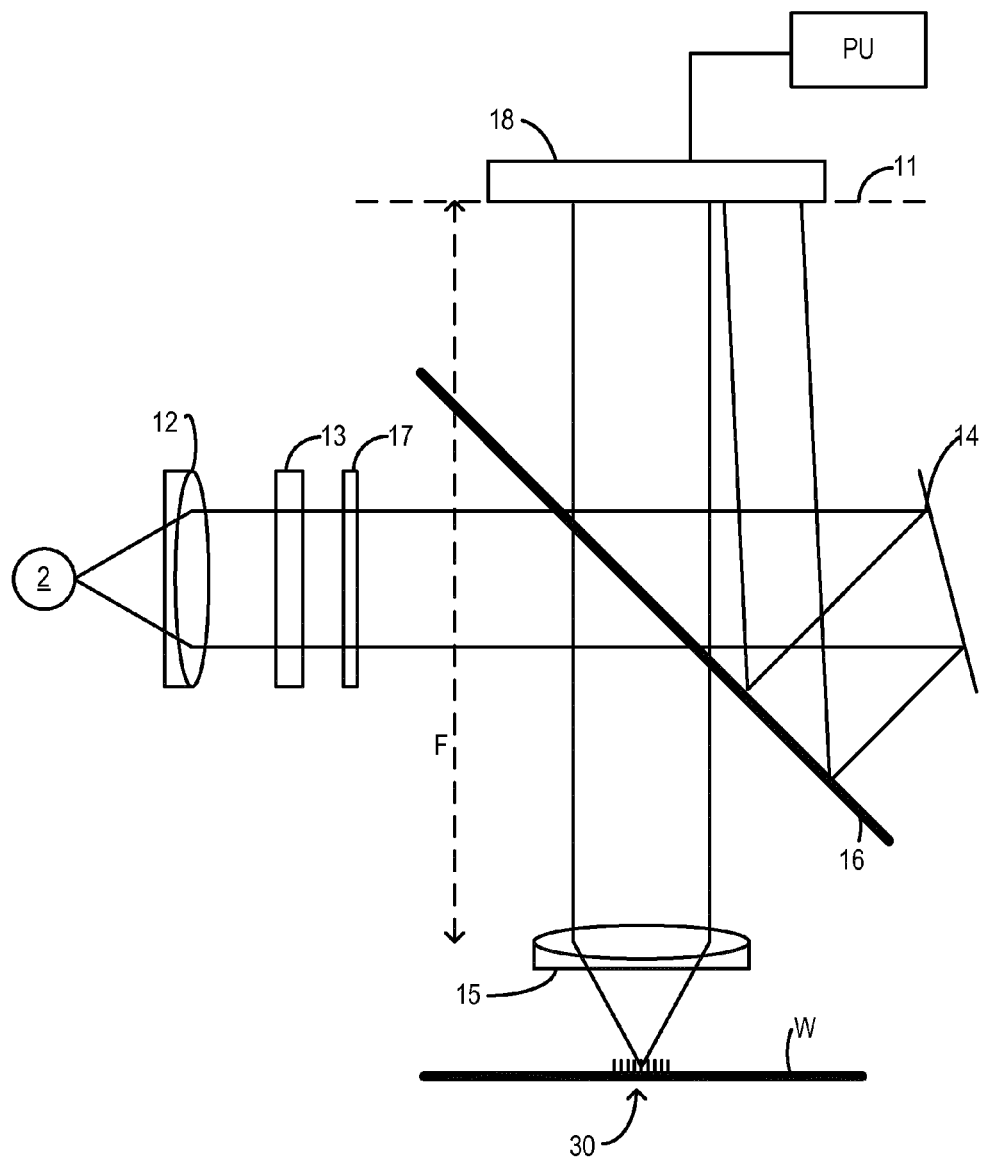
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least $2\Delta\lambda$, (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using one of the scatterometers described above in combination with modeling of a target structure such as the target 30 and its diffraction properties, measurement of image characteristics can be performed in a number of ways. These measurements can be used to correct for systematic errors in these image characteristics. The image characteristics for which these corrections are made may comprise overlay and/or CD (as described above) and/or any other image characteristic of the lithographic process.

One such method may comprise the following steps:

1) performing a test exposure. The test exposure may comprise a number of targets, each having an image characteristic error in x and y. This error is measured for each target. The test exposure can either be an exposure specifically performed to determine the corrections. Alternatively, measurement data from previous exposed production lots may be used for determining corrections for subsequent lots (in an automated feedback loop).

2) defining a system model. The model may describe the error at a target during the next exposure as a function of one or more system parameters.

3) estimating an optimal system parameter which results in an optimal correction for a next exposure. This may be done by minimisation of a cost function derived from the system model.

4) using the optimal system parameters in a future exposure.

Figure 5:
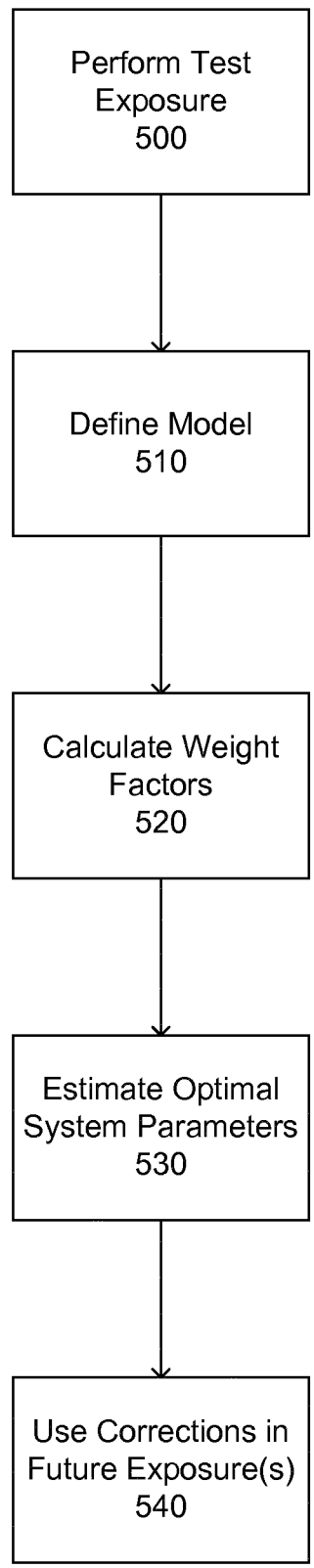
FIG. 5 is a flowchart depicting a correction method according to an embodiment of the invention.

FIG. 5 is a flowchart describing a method which improves on the above method by taking into account a characteristic of a product feature: that is a feature of the product being manufactured by the lithographic process.

At step 500, a test exposure is performed. The test exposure may comprise N targets (possibly in a matrix), whereby each target has an image characteristic error $E_n^{(m)}$ (in x and y). This error may be measured for each target yielding a set of N measured vectors:

$$E_n^{(m)} = [E_{n\ x}^{(m)}; E_{n\ y}^{(m)}]; n=1,\ldots,N$$

where $E_{n\ x}^{(m)}$ is the x component of $E_n^{(m)}$ and $E_{n\ y}^{(m)}$ is the y component of $E_n^{(m)}$ In a particular embodiment, the measured errors may comprise overlay errors $E_n^{(OVL,m)}$ and/or CD errors $E_n^{(CD,m)}$ such that:

$$E_n^{(OVL,m)} = [E_{n\ x}^{(OVL,m)}; E_{n\ y}^{(OVL,m)}]; \text{ and}$$

$$E_n^{(CD,m)} = [E_{n\ x}^{(CD,m)}; E_{n\ y}^{(CD,m)}]; n=1,\ldots,N$$

As before, instead of a specific test exposure, measurement data from previously exposed production lots may be used.

At step 510, a model is defined $E_n$ (P) which describes error $E_n$ at target N during the next exposure as a function of at least one system parameter P. The system parameter P comprises (for example) $k_1$ adjustment parameters for the lens and $k_2$ adjustment parameters for the dynamics (such as the servo system). In general: $k_1+k_2 \ll N$.

In terms of the particular embodiment of correcting for overlay and/or CD the models are:

Overlay Errors: $E_n^{(OVL)}(P)$, parameters $P=[P_1, \ldots, P_K]$;
CD Errors: $E_n^{(CD)}(P)$, parameters $P=[P_1, \ldots, P_K]$ At step 520, product feature characteristics are evaluated and translated into weight factors $W_n$ for the model. Product feature characteristics may comprise (for example) the direction or angle of an element (such as a line, area or structure), a position of an element or any feature relating to specific areas within the product. Weight factors may also take into account preferred characteristics, such as characteristics preferred due to limitations of the tool. By way of example, a lithographic apparatus may have a more limited correction capability in one direction (e.g. x direction) compared to another direction (e.g. y direction). The weight factors can take this into account during this step by favouring corrections in the y direction. Clearly, step 520 may be performed in advance of the other steps of this method.

With specific reference to overlay and CD, weight Factors $W_n^{(OVL)}$ and $W_n^{(CD)}$ are determined from product feature characteristics and/or preferred characteristics.

At step 530, an estimation is made for the system parameter P which results in an optimal image characteristic correction for a next exposure. An optimal correction may be a correction calculated to provide a minimal total error according to a cost function. The cost function includes the weight factors calculated at the step 520. In this way, the product feature characteristic is taken into account during the estimation.

For example, to calculate the value of P yielding the Minimum of Cost Function $J_{min}(P_{opt})$;

$$J_{min}(P_{opt}) = \text{Min}_P J(E_n^{(m)}; E_n(P) * W_n)$$

In an embodiment, the cost function may be realised as a least squares algorithm:

$$J(P_{opt}=P) = \text{Min}(\Sigma_{n=1,\ldots,N}\{[E_n(P)-E_n^{(m)}]^T * W_n\}^2);$$
$$W_n = [W_{n,x}; W_n]$$

once again considering the specific examples of overlay and CD and minimizing for both together (individual minimization is possible), the cost function is:

$$J(P_{opt}=P) = \text{Min}(\Sigma_{n=1,\ldots,N}(\{[E_n^{(OVL)}(P) - E_n^{(OVL,m)}]^T * W_n^{(OVL)}\}^2 + \{[E_n^{(CD)}(P) - E_n^{(CD,m)}]^T * W_n^{(CD)}\}^2));$$

$$W_n^{(OVL)} = [W_{n,x}^{(OVL)}; W_{n,y}^{(OVL)}];$$
$$W_n^{(CD)} = [W_{n,x}^{(CD)}; W_{n,y}^{(CD)}]$$

At step 540, the calculated optimal system parameters are used during the next or a future exposure.

An example of a product feature characteristic which may be translated into a weight factor may be a characteristic relating to the shape and/or angle of a product feature; for example to help align subsequent features to the product feature in overlay corrections. In a very specific example, the product feature may comprise a target area which is tilted with respect to the x and y directions, and the product feature characteristic may be the angle of this tilt. Such tilted target areas may be found in certain DRAM (dynamic random access memory) structures.

Figure 6:
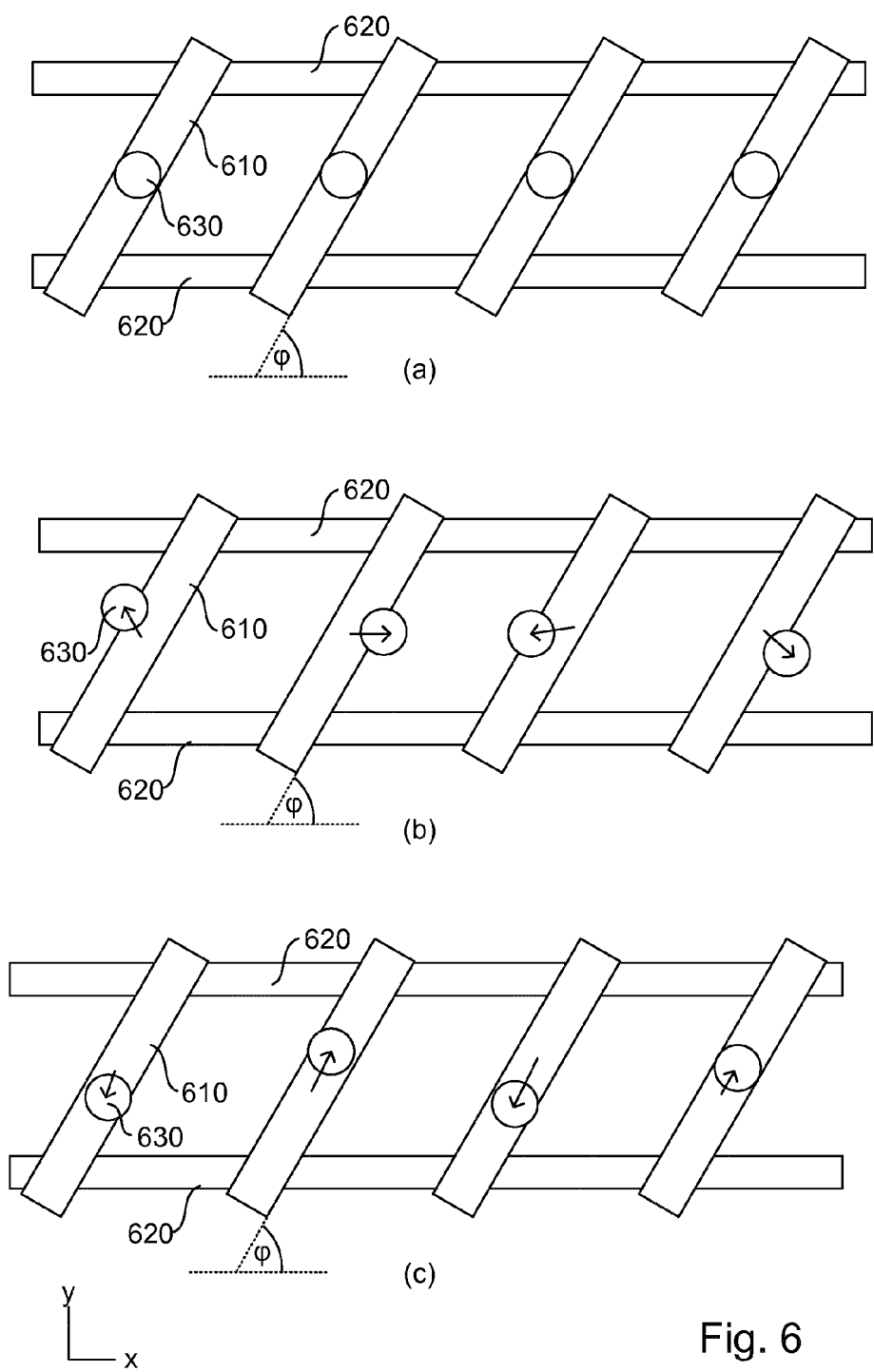
FIG. 6 depicts tilted target areas aligned with contact holes: (a) in the perfect case; (b) in accordance with a known correction method; and (c) in accordance with a correction method according to an embodiment of the invention.

FIG. 6 illustrates such a tilted target area structure. It comprises tilted target areas 610 between gate lines 620 and tilted at angle φ (with respect to the x-axis). On each tilted target area 610 is a contact hole 630. Tilted target area 610 may be the active area for a memory structure, onto which is printed a contact hole 630 to connect the bitline to the active area. For such a structure, the actual position of a contact hole 630 is less important than its position relative to its tilted target area 610. A main criterion is that the overlap of contact hole 630 and tilted target area 610 is maximised (ensuring that the contact hole 630 does not stray too close to one of the two gate lines 620).

FIG. 6(a) illustrates an ideal case where each contact hole 630 is aligned in the centre of its corresponding tilted target area 610, and equidistant to each of the gate lines 620 with zero overlay error. However, such an ideal case is not realistic.

FIG. 6(b) illustrates an example which has resulted from using error correction without any weighting based on product feature characteristics. As a result, the cost function is minimised for overlay errors over the whole field. Corrections to the contact hole 630 position are in all directions and therefore overlay of the contact hole 630 and tilted target area 610 is not optimized FIG. 6(c) illustrates an example where a method in accordance with an embodiment of the invention has been used. Here errors have been minimised in the direction perpendicular to the tilted target area 610, with errors in the direction parallel to the tilted target area 610 being deemed less critical. This results in a tendency for the contact hole 630 to remain in good registration with the tilted target area 610. This may be done by applying a weight factor $W_n$ which favours solutions to the cost function which result in any errors being in the direction parallel to the tilted target area 610 over solutions which result in any errors being in the direction perpendicular to the tilted target area 610. The weight factor may achieve this by applying a coordinate transformation in directions perpendicular and parallel to the tilted feature:

$$W_n = R * W'_n; \text{ wherein } R = [\cos \varphi, -\sin \varphi; \sin \varphi, \cos \varphi]$$
$$\text{and } W'_{n,x} << W'_{n,y}$$

A polar coordinate system may be used as an alternative.

Another method to derive a y offset profile from the tilt angle may comprise multiplying the measured x residual by tan φ.

Alternatively or in combination, the product feature characteristic may relate to a profile comprising several regions. These regions can be accounted for by making the weight factor dependent on n, wherein n correlates to the regions.

Additionally, the weight factor can be made dependent on measured parameters. If the measured CD at a certain field location is larger, more overlay tolerance may be allowed at that position. This means that $W_n^{(ovl)}$ can be made a bit smaller, if $E_n^{(CD,m)}$ is larger.

Note that for non-tilted target areas the compensation of x errors with y corrections is not possible. However, optimization towards a line instead of a point may still bring a benefit where actuators have a coupling between x and y. This would allow tighter control x at the expense of y control.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of correcting an image characteristic of a substrate onto which one or more instances of one or more product features have been formed using a lithographic process, the method comprising:
measuring an error in the image characteristic of the substrate; and
determining a correction for a subsequent formation of one or more further instances of the one or more product features based upon the measured error and a value of a characteristic of one or more of the product feature(s).

2. A method as claimed in claim 1, further comprising:
calculating one or more weight factors based upon the product feature characteristic value; and
using the one or more weight factors when determining the correction for a subsequent formation of one or more instances of the product feature(s).

3. A method as claimed in claim 2, further comprising:
determining a model of the measured error on the substrate as a function of one or more parameters of the lithographic process;
estimating an optimal value for the one or more parameters using the model weighted by the one or more weight factors; and
using the estimated optimal value in the determination of a correction for a subsequent formation of one or more instances of the product feature(s).

4. A method as claimed in claim 2, wherein the one or more weighting factors are operable such that a resultant determined correction in one or more favoured directions is favoured over a correction in a direction other than the one or more favoured directions.

5. A method as claimed in claim 2, wherein the one or more formed instances of the product feature(s) comprise one or more target areas and the one or more weighting factors are operable to favour a resultant determined correction which results in an instance of the product feature(s) formed subsequently to be formed within the target area.

6. A method as claimed in claim 5, wherein the one or more target areas are tilted relative to a coordinate system of the substrate, and the product feature characteristic comprises the angle of the tilt.

7. A method as claimed in claim 1, wherein measuring the error comprising measuring the error from one or more test structures which have been formed on the substrate.

8. An inspection apparatus for inspecting a substrate onto which one or more instances of one or more product features have been formed using a lithographic process, the inspection apparatus being operable to:
measure an error in an image characteristic of a substrate from one or more metrology target structures on the substrate; and
determine a correction for a subsequent formation of one or more further instances of the one or more product features based upon the measured error and a value of a characteristic of one or more of the product feature(s).

9. An inspection apparatus as claimed in claim 8, being operable to:
calculate one or more weight factors based upon the product feature characteristic value; and
use the one or more weight factors when determining the correction for a subsequent formation of one or more instances of the product feature(s).

10. An inspection apparatus as claimed in claim 9, being operable to:
determine a model of the measured error on the substrate as a function of one or more parameters of the lithographic process;
estimate an optimal value for the one or more parameters using the model weighted by the one or more weight factors; and
use the estimated optimal value in the determination of a correction for a subsequent formation of one or more instances of the product feature(s).

11. An inspection apparatus as claimed in claim 10, being operable to estimate the optimal value by minimising a cost function derived from the model weighted by the one or more weight factors so as to determine a minimum total error in accordance with the weighting.

12. An inspection apparatus as claimed in claim 9, wherein at least one weight factor is further dependent on a measured image characteristic.

13. An inspection apparatus as claimed in claim 12, wherein:
the measured image characteristic is the critical dimension of an instance of the product feature(s) at a certain position on the substrate, and the at least one weighting factor is operable such that a tolerance at the certain position for alignment of a subsequent instance of the product featured is greater when the value of the measured critical dimension is greater.

14. An inspection apparatus as claimed in claim 9, wherein the one or more weighting factors are operable such that a resultant determined correction in one or more favoured directions is favoured over a correction in a direction other than the one or more favoured directions.

15. An inspection apparatus as claimed in claim 9, wherein the one or more formed instances of the product feature(s) comprise one or more target areas and the one or more weighting factors are operable to favour a resultant determined correction which results in an instance of the product feature(s) formed subsequently to be formed within the target area.

16. An inspection apparatus as claimed in claim 15, wherein the one or more target areas are tilted relative to a coordinate system of the substrate, and the product feature characteristic comprises the angle of the tilt.

17. An inspection apparatus as claimed in claim 16, wherein the tilted target area(s) comprises an elongate form and the one or more weighting factors are operable:
to align the coordinate system with the tilted target area(s), and
such that a resultant determined correction in a direction parallel to the elongate form of the tilted target area is favoured over a correction in a direction perpendicular to the elongate form of the tilted target area.

18. An inspection apparatus as claimed in claim 8, wherein the measurement of the error comprises measurement of the error from one or more test structures which have been formed on the substrate.

19. A lithographic apparatus comprising:
an inspection apparatus as claimed in claim 8; and
a lithographic tool configured to form the product feature(s) on the substrate using a lithographic process.

20. A non-transitory computer-readable medium comprising a computer program comprising one or more sequences of machine-readable instructions configured to cause at least:
measurement of an error in the image characteristic of a substrate onto which one or more instances of one or more product features have been formed using a lithographic process; and
determination of a correction for a subsequent formation of one or more further instances of the one or more product features based upon the measured error and a value of a characteristic of one or more of the product feature(s).

* * * * *